US009310188B2

(12) United States Patent
Snis

(10) Patent No.: US 9,310,188 B2
(45) Date of Patent: Apr. 12, 2016

(54) ENERGY BEAM DEFLECTION SPEED VERIFICATION

(71) Applicant: Arcam AB, Moelndal (SE)

(72) Inventor: Anders Snis, Uddevalla (SE)

(73) Assignee: Arcam AB, Moelndal (SE)

( * ) Notice: Subject to any disclaimer, the term of this patent is extended or adjusted under 35 U.S.C. 154(b) by 0 days.

(21) Appl. No.: 14/750,752

(22) Filed: Jun. 25, 2015

(65) Prior Publication Data

US 2016/0054347 A1  Feb. 25, 2016

Related U.S. Application Data

(60) Provisional application No. 62/039,626, filed on Aug. 20, 2014, provisional application No. 62/093,882, filed on Dec. 18, 2014, provisional application No. 62/097,328, filed on Dec. 29, 2014.

(51) Int. Cl.
*G01J 5/02* (2006.01)
*G01B 11/14* (2006.01)
*B22F 3/105* (2006.01)
(Continued)

(52) U.S. Cl.
CPC .............. *G01B 11/14* (2013.01); *B22F 3/1055* (2013.01); *B23K 15/02* (2013.01); *B23K 26/032* (2013.01); *B23K 26/046* (2013.01); *B23K 26/70* (2015.10); *G01B 11/00* (2013.01); *G01B 15/00* (2013.01); *G01P 3/36* (2013.01); *G01P 21/00* (2013.01); *B22F 2003/1057* (2013.01);
(Continued)

(58) Field of Classification Search
CPC ........................................................ B23K 15/02
See application file for complete search history.

(56) References Cited

U.S. PATENT DOCUMENTS 3,882,477 A    5/1975  Mueller
4,348,576 A *  9/1982  Anderl et al. .......... B23K 15/02
                                                    219/121 EW
(Continued)

FOREIGN PATENT DOCUMENTS

DE    19952998 A1    5/2001
DE    20305843 U1    7/2003
(Continued)

OTHER PUBLICATIONS

Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.
Guibas, Leonidas J., et al., "Randomized Incremental Construction of Delaunay and Voronoi Diagrams", Algorithmica, Jun. 1992, pp. 381-413, vol. 7, Issue 1-6, Springer-Verlag, New York.
Weigel, Th. , et al., "Design and Preparation of Polymeric Scaffolds for Tissue Engineering," Expert Rev. Med. Devices, 2006, pp. 835-851, vol. 3, No. 6, XP002691485.
(Continued)

*Primary Examiner* — Kiho Kim
(74) *Attorney, Agent, or Firm* — Alston & Bird LLP

(57) ABSTRACT

A method for verifying a deflection speed of an energy beam spot, the method comprising the steps of: providing a predetermined pattern on a work table with the energy beam spot while deflecting the energy beam spot with a first deflection speed, detecting first positions of the energy beam spot on the work table created with the first deflection speed, providing the predetermined pattern on a work table with the energy beam spot while deflecting the energy beam spot with a second deflection speed, detecting second positions of the energy beam spot on the work table created with the second deflection speed, comparing the first and second positions, wherein the deflection speed is verified if each one of the first positions are deviating less than a predetermined distance from corresponding second positions.

21 Claims, 12 Drawing Sheets

(51) Int. Cl.
*G01B 11/00* (2006.01)
*G01B 15/00* (2006.01)
*G01P 3/36* (2006.01)
*G01P 21/00* (2006.01)
*B23K 15/02* (2006.01)
*B23K 26/03* (2006.01)
*B23K 26/04* (2014.01)
*B33Y 10/00* (2015.01)
*B33Y 30/00* (2015.01)
*B33Y 50/02* (2015.01)
*B33Y 40/00* (2015.01)

(52) U.S. Cl.
CPC ............... *B33Y 10/00* (2014.12); *B33Y 30/00* (2014.12); *B33Y 40/00* (2014.12); *B33Y 50/02* (2014.12)

(56) References Cited

U.S. PATENT DOCUMENTS

| | | | |
|---|---|---|---|
| 4,401,719 | A | 8/1983 | Kobayashi et al. |
| 4,818,562 | A | 4/1989 | Arcella et al. |
| 4,863,538 | A | 9/1989 | Deckard |
| 4,927,992 | A | 5/1990 | Whitlow et al. |
| 5,182,170 | A | 1/1993 | Marcus et al. |
| 5,647,931 | A | 7/1997 | Retallick et al. |
| 5,753,274 | A | 5/1998 | Wilkening et al. |
| 5,837,960 | A | 11/1998 | Lewis et al. |
| 5,876,550 | A | 3/1999 | Feygin et al. |
| 5,904,890 | A | 5/1999 | Lohner et al. |
| 5,932,290 | A | 8/1999 | Lombardi et al. |
| 6,046,426 | A | 4/2000 | Jeantette et al. |
| 6,162,378 | A | 12/2000 | Bedal et al. |
| 6,419,203 | B1 | 7/2002 | Dang |
| 6,554,600 | B1 | 4/2003 | Hofmann et al. |
| 6,583,379 | B1 | 6/2003 | Meiners et al. |
| 6,751,516 | B1 | 6/2004 | Richardson |
| 6,764,636 | B1 | 7/2004 | Allanic et al. |
| 6,811,744 | B2 | 11/2004 | Keicher et al. |
| 6,815,636 | B2 | 11/2004 | Chung et al. |
| 6,824,714 | B1 | 11/2004 | Türck et al. |
| 7,003,864 | B2 | 2/2006 | Dirscherl |
| 7,165,498 | B2 | 1/2007 | Mackrill et al. |
| 7,204,684 | B2 | 4/2007 | Ederer et al. |
| 7,540,738 | B2 | 6/2009 | Larsson et al. |
| 7,686,605 | B2 | 3/2010 | Perret et al. |
| 7,696,501 | B2 | 4/2010 | Jones |
| 7,713,454 | B2 | 5/2010 | Larsson |
| 7,799,253 | B2 | 9/2010 | Höchsmann et al. |
| 7,871,551 | B2 | 1/2011 | Wallgren et al. |
| 8,021,138 | B2 | 9/2011 | Green |
| 8,083,513 | B2 | 12/2011 | Montero-Escuder et al. |
| 8,308,466 | B2 | 11/2012 | Ackelid et al. |
| 8,992,816 | B2 | 3/2015 | Jonasson et al. |
| 9,073,265 | B2 | 7/2015 | Snis |
| 9,079,248 | B2 | 7/2015 | Ackelid |
| 9,126,167 | B2 | 9/2015 | Ljungblad |
| 2002/0104973 | A1 | 8/2002 | Kerekes |
| 2003/0133822 | A1 | 7/2003 | Harryson |
| 2004/0084814 | A1 | 5/2004 | Boyd et al. |
| 2004/0104499 | A1 | 6/2004 | Keller |
| 2004/0173946 | A1 | 9/2004 | Pfeifer et al. |
| 2005/0186538 | A1 | 8/2005 | Uckelmann |
| 2006/0108712 | A1 | 5/2006 | Mattes |
| 2006/0147332 | A1 | 7/2006 | Jones et al. |
| 2006/0157892 | A1 | 7/2006 | Larsson |
| 2006/0180957 | A1 | 8/2006 | Hopkinson et al. |
| 2007/0175875 | A1 | 8/2007 | Uckelmann et al. |
| 2007/0182289 | A1 | 8/2007 | Kigawa et al. |
| 2007/0298182 | A1 | 12/2007 | Perret et al. |
| 2009/0017219 | A1 | 1/2009 | Paasche et al. |
| 2009/0152771 | A1 | 6/2009 | Philippi et al. |
| 2011/0133367 | A1 | 6/2011 | Weidinger et al. |
| 2011/0316178 | A1 | 12/2011 | Uckelmann |
| 2012/0100031 | A1 | 4/2012 | Ljungblad |
| 2012/0223059 | A1 | 9/2012 | Ljungblad |
| 2014/0301884 | A1 | 10/2014 | Hellestam et al. |
| 2014/0314609 | A1 | 10/2014 | Ljungblad et al. |
| 2014/0314964 | A1 | 10/2014 | Ackelid |
| 2014/0348691 | A1 | 11/2014 | Ljungblad et al. |
| 2014/0367367 | A1 | 12/2014 | Wood et al. |
| 2015/0004045 | A1 | 1/2015 | Ljungblad |
| 2015/0071809 | A1 | 3/2015 | Nordkvist et al. |
| 2015/0086409 | A1 | 3/2015 | Hellestam |
| 2015/0088295 | A1 | 3/2015 | Hellestam |
| 2015/0151490 | A1 | 6/2015 | Jonasson et al. |
| 2015/0165524 | A1 | 6/2015 | Ljungblad et al. |
| 2015/0165525 | A1 | 6/2015 | Jonasson |
| 2015/0174658 | A1 | 6/2015 | Ljungblad |
| 2015/0174695 | A1 | 6/2015 | Elfstroem et al. |
| 2015/0251249 | A1 | 9/2015 | Fager |
| 2015/0283613 | A1 | 10/2015 | Backlund et al. |
| 2015/0290710 | A1 | 10/2015 | Ackelid |

FOREIGN PATENT DOCUMENTS

| | | |
|---|---|---|
| DE | 102005014483 A1 | 10/2006 |
| DE | 202008005417 U1 | 8/2008 |
| DE | 102007018601 A1 | 10/2008 |
| DE | 102008012064 A1 | 9/2009 |
| EP | 0289116 A1 | 11/1988 |
| EP | 0688262 A1 | 12/1995 |
| EP | 1418013 A1 | 5/2004 |
| EP | 1466718 A2 | 10/2004 |
| EP | 1683593 A2 | 7/2006 |
| EP | 1721725 A1 | 11/2006 |
| EP | 1952932 A2 | 8/2008 |
| EP | 2011631 A1 | 1/2009 |
| EP | 2119530 A1 | 11/2009 |
| EP | 2281677 A1 | 2/2011 |
| JP | 2003245981 | 9/2003 |
| SE | 524467 C2 | 8/2004 |
| WO | WO 93/08928 | 5/1993 |
| WO | WO 97/37523 A2 | 10/1997 |
| WO | WO 01/81031 A1 | 11/2001 |
| WO | WO 01/85386 A2 | 11/2001 |
| WO | WO 02/08653 A1 | 1/2002 |
| WO | WO 2004/043680 A2 | 5/2004 |
| WO | WO 2004/054743 A1 | 7/2004 |
| WO | WO 2004/056511 A1 | 7/2004 |
| WO | WO 2006/091097 A2 | 8/2006 |
| WO | WO 2006/121374 A1 | 11/2006 |
| WO | WO 2007/112808 A1 | 10/2007 |
| WO | WO 2008/013483 A1 | 1/2008 |
| WO | WO 2008/057844 A1 | 5/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |
| WO | WO 2010/095987 A1 | 8/2010 |
| WO | WO 2011/008143 A1 | 1/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2014/071968 A1 | 5/2014 |
| WO | WO 2014/095200 A1 | 6/2014 |
| WO | WO 2014/095208 A1 | 6/2014 |

OTHER PUBLICATIONS

Yang, et al., "The Design of Scaffolds for Use in Tissue Engineering, Part II, Rapid Prototyping Techniques", Tissue Engineering, 2002, pp. 1-11, vol. 8, No. 1, XP002691484.

* cited by examiner

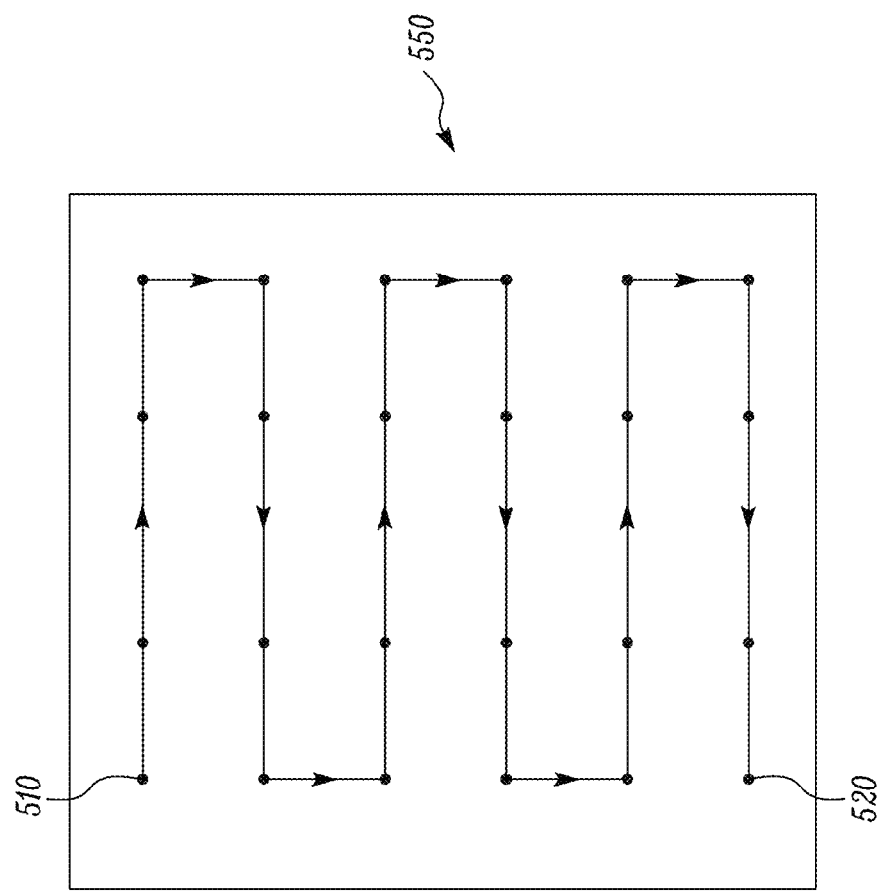

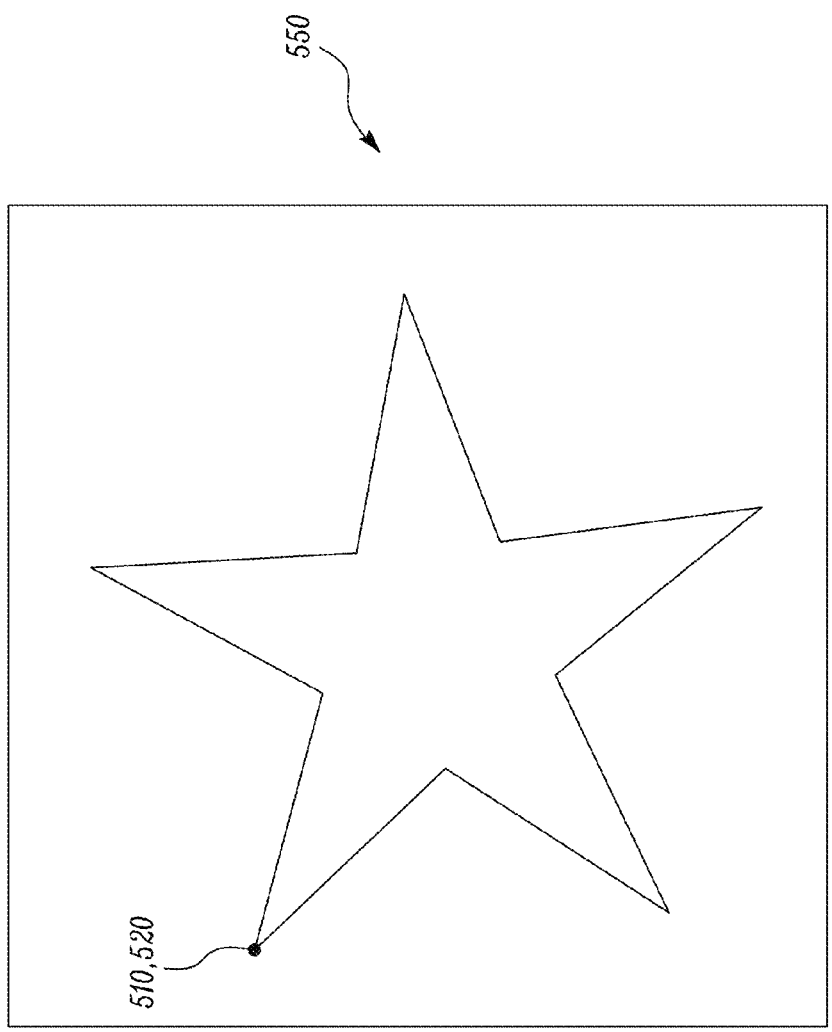

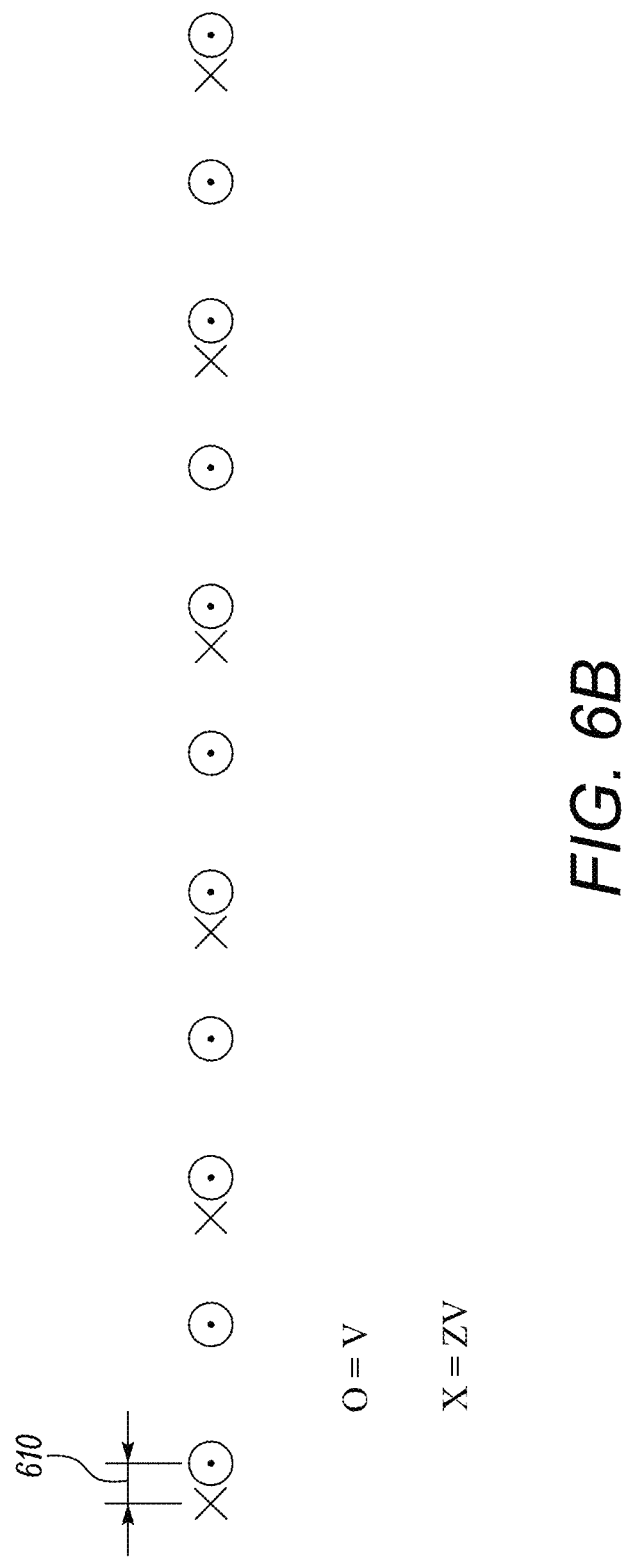

ENERGY BEAM DEFLECTION SPEED VERIFICATION

CROSS-REFERENCE TO RELATED APPLICATIONS

This application claims priority to and the benefit of U.S. Provisional Patent Application Ser. No. 62/039,626, filed Aug. 20, 2014; U.S. Provisional Patent Application Ser. No. 62/093,882, filed Dec. 18, 2014; and U.S. Provisional Patent Application Ser. No. 62/097,328, filed Dec. 29, 2014; the contents of all of which as are hereby incorporated by reference in their entirety.

BACKGROUND

1. Related Field

Various embodiments of the present invention relates to a method for deflection speed verification of an energy beam.

2. Description of Related Art

Freeform fabrication or additive manufacturing is a method for forming three-dimensional articles through successive fusion of chosen parts of powder layers applied to a worktable. A method and apparatus according to this technique is disclosed in US 2009/0152771.

Such an apparatus may comprise a work table on which the three-dimensional article is to be formed, a powder dispenser, arranged to lay down a thin layer of powder on the work table for the formation of a powder bed, an energy beam source for delivering an energy beam spot to the powder whereby fusion of the powder takes place, elements for control of the energy beam spot over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

In order to melt the powder material at specific locations there is a need to inter alia verify the deflection speed of the energy beam spot. One needs to know that different deflection speeds at different areas of the powder bed correspond to the desired deflection speeds. There is a need in the art for a simple and efficient method for verifying the deflection speed of an energy beam such as a laser beam or an electron beam.

BRIEF SUMMARY

Having this background, an object of the invention is to provide a method and system for verification of a deflection speed of an energy beam spot. The above-mentioned object is achieved by the features according to the claims contained herein.

In a first aspect of various embodiments of the invention it is provided a method for verifying a deflection speed of an energy beam spot. The method comprises the steps of: providing a predetermined pattern on a work table with the energy beam spot while deflecting the energy beam spot with a first deflection speed, detecting first positions of the energy beam spot on the work table created with the first deflection speed, providing the predetermined pattern on a work table with the energy beam spot while deflecting the energy beam spot with a second deflection speed, detecting second positions of the energy beam spot on the work table created with the second deflection speed, and comparing the first and second positions, wherein the deflection speed is verified if each one of the first positions are deviating less than a predetermined distance from corresponding second positions.

A non-limiting and exemplary advantage of this method is that the lateral position of the work table is not required to be known for verifying the deflection speed of the energy beam. Another non-limiting and exemplary advantage is that the angle of the work table is not required to be known for verifying the deflection speed of the energy beam. Still another non-limiting and exemplary advantage of the present invention is that it provides for a simple method for verifying speed and position stability of an energy beam.

In another non-limiting and exemplary embodiment the pattern is a continuous pattern or a discontinuous pattern. A non-limiting and exemplary advantage of this embodiment is that any type of continuous or discontinuous pattern may be used for verifying the deflection speed.

In another non-limiting and exemplary embodiment the discontinuous pattern is created by switching on and off the energy beam. A non-limiting and exemplary advantage of this embodiment is that the switching mechanism may also be verified.

In still another non-limiting and exemplary embodiment of the present invention the energy beam spot is a laser beam spot or an electron beam spot. A non-limiting and exemplary advantage of this example embodiment is that it is applies equally to a laser based system as to an electron beam based system.

In still another non-limiting and exemplary embodiment of the present invention the positions may be detected by an IR-camera, a CCD-camera, a digital camera, a CMOS camera or a NIR-camera. A non-limiting and exemplary advantage of this example embodiment is that almost all types of cameras may be used for detecting the position of the energy beam on the work table.

In still another non-limiting and exemplary embodiment of the present invention the pattern may be a 1-dimensional or a 2-dimensional pattern. A non-limiting and exemplary advantage of this embodiment is that one may choose which type of pattern, 1- or 2-dimensional, to use. Obviously a 1-dimensional pattern may only verify the deflection speed in 1-dimension if not the 1-dimensional pattern is rotated and reused several times on the work table.

In yet another non-limiting and exemplary embodiment the predetermined pattern provided on the worktable with the first and second deflection speeds are superimposed on the same work table. A non-limiting and exemplary advantage of this embodiment is that topographical variations that may be present on a single work table or on different work tables may not influence the result of the beam deflection speed verification since the pattern is repeated with different deflection speeds on top of each other.

In still another non-limiting and exemplary embodiment the predetermined distance is less than 100 μm. A non-limiting and exemplary advantage of this embodiment is that relatively small deviations, in the order of the beam spot size, may relatively easily be detected depending on the resolution of the camera used.

In still another non-limiting and exemplary embodiment the verification method further comprises the step of sending out a warning signal if any one of the first and second positions is deviating more than the predetermined distance. A non-limiting and exemplary advantage of this embodiment is that deviating positions indicating a non-calibrated deflection speed may be sent out as a warning signal/message to a user of the energy beam deflection equipment. A large enough deviation in position may also switch off the beam deflection equipment.

In still another non-limiting and exemplary embodiment the verification method further comprises the step of receiving and storing, within one or more memory storage areas, a model of at least one three-dimensional article; and at least the steps of generating the predetermined pattern on a work table with the energy beam spot while deflecting the energy beam spot with a second deflection speed and comparing the first and second positions of the energy beam spot on the work table are performed via execution of one or more computer processors.

In another aspect of various embodiments of the present invention it is provided a use of a verifying method according to any one of the disclosed embodiment in an additive manufacturing apparatus in which the energy beam spot is used for fusing powder material layerwise for forming three-dimensional articles. A non-limiting and exemplary advantage of this embodiment is that the accuracy of build 3-dimensional parts may further be improved.

The additive manufacturing apparatus for verifying a deflection speed of an energy beam spot may comprise an energy beam source configured to generate an energy beam spot; and a control unit. The control unit is configured for: generating a predetermined pattern on a work table with the energy beam spot while deflecting the energy beam spot with a first deflection speed; detecting first positions of the energy beam spot on the work table created with the first deflection speed; generating the predetermined pattern on a work table with the energy beam spot while deflecting the energy beam spot with a second deflection speed; detecting second positions of the energy beam spot on the work table created with the second deflection speed; and comparing the first and second positions, wherein the deflection speed is verified if each one of the first positions are deviating less than a predetermined distance from corresponding ones of the second positions.

The additive manufacturing apparatus in certain embodiments may further comprise an image capture device configured to at least one of capture or compare the first and second positions.

According to various embodiments, a program element is also provided. The program element is configured and arranged when executed on a computer to implement a method for verifying a deflection speed of an energy beam spot. The method comprises the steps of: generating a predetermined pattern on a work table with the energy beam spot while deflecting the energy beam spot with a first deflection speed; detecting first positions of the energy beam spot on the work table created with the first deflection speed; generating the predetermined pattern on a work table with the energy beam spot while deflecting the energy beam spot with a second deflection speed; detecting second positions of the energy beam spot on the work table created with the second deflection speed; and comparing the first and second positions, wherein the deflection speed is verified if each one of the first positions are deviating less than a predetermined distance from corresponding ones of the second positions.

According to various embodiments, a non-transitory computer program product comprising at least one computer-readable storage medium having computer-readable program code portions embodied therein may be provided. The computer-readable code portions comprise: an executable portion configured for generating a predetermined pattern on a work table with the energy beam spot while deflecting the energy beam spot with a first deflection speed; an executable portion configured for detecting first positions of the energy beam spot on the work table created with the first deflection speed; an executable portion configured for generating the predetermined pattern on a work table with the energy beam spot while deflecting the energy beam spot with a second deflection speed; an executable portion configured for detecting second positions of the energy beam spot on the work table created with the second deflection speed; and an executable portion configured for comparing the first and second positions, wherein the deflection speed is verified if each one of the first positions are deviating less than a predetermined distance from corresponding ones of the second positions.

BRIEF DESCRIPTION OF THE SEVERAL VIEWS OF THE DRAWINGS

Figure 1:
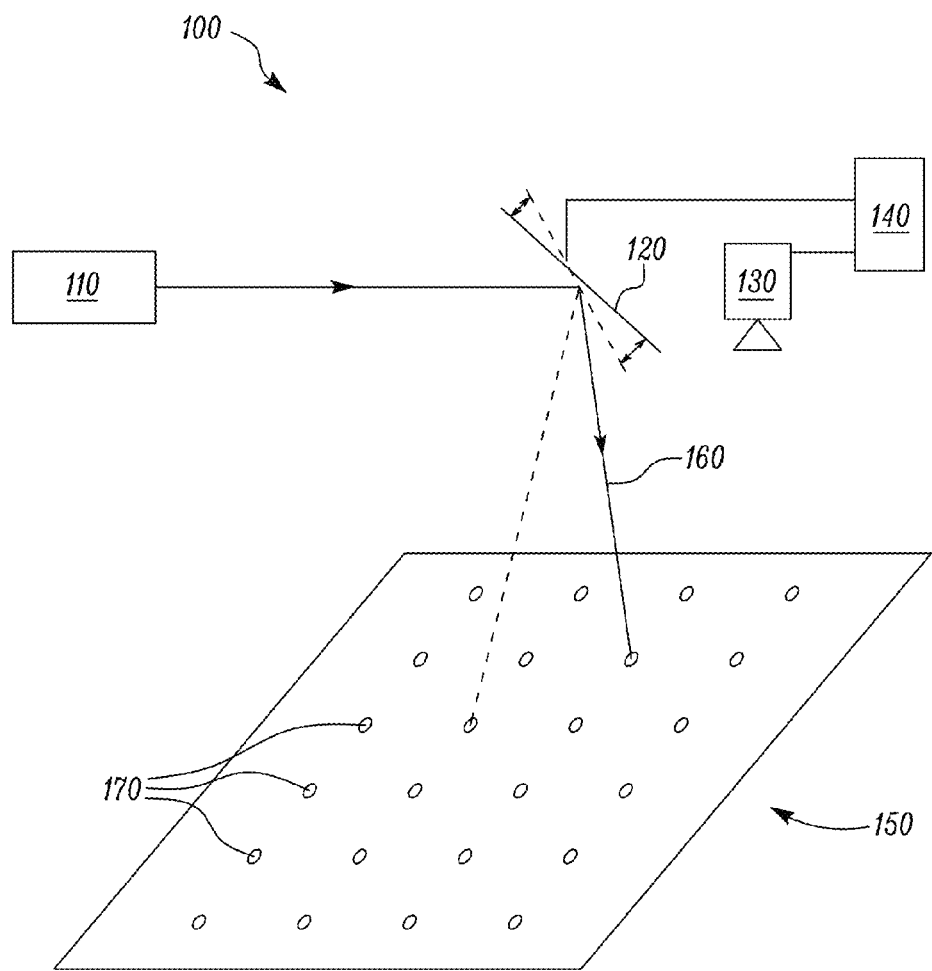
Figure 2:
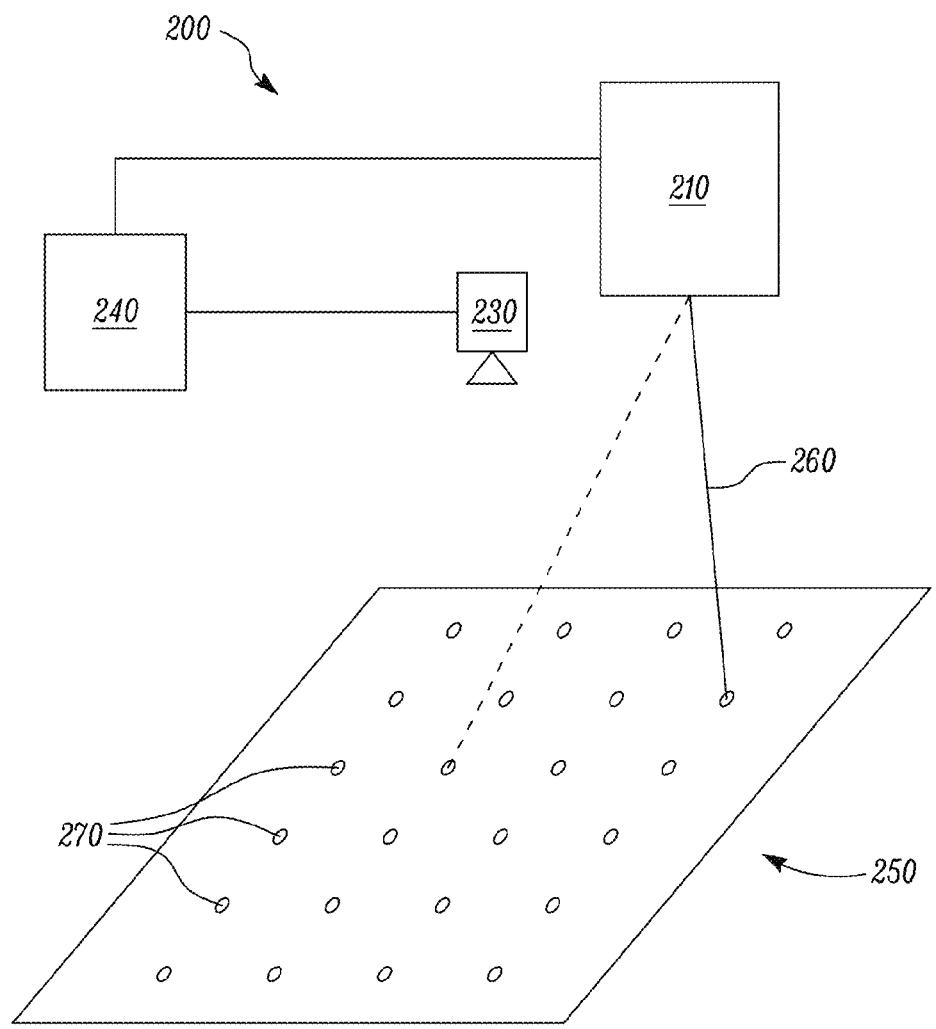
Figure 3:
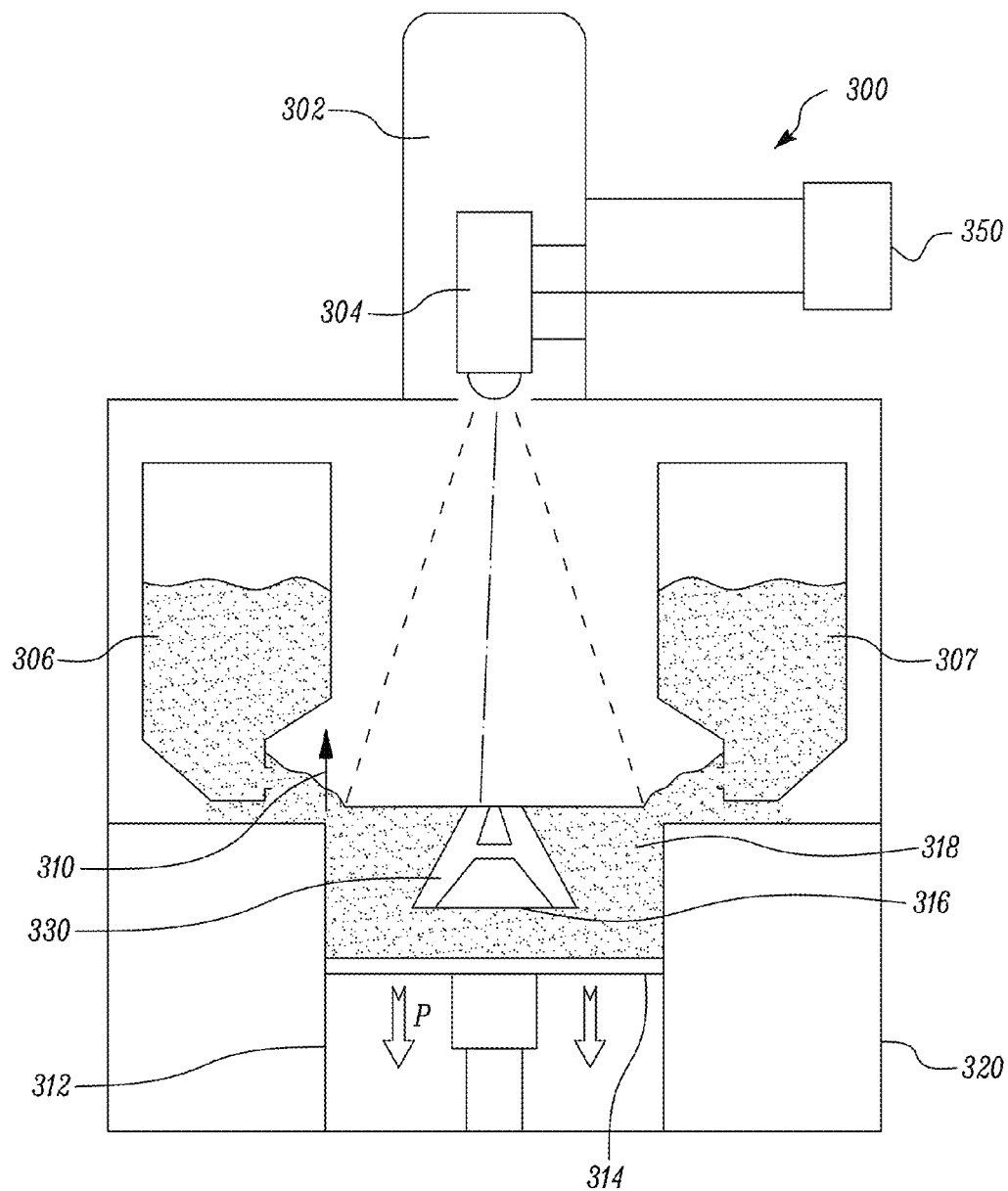
Figure 4:
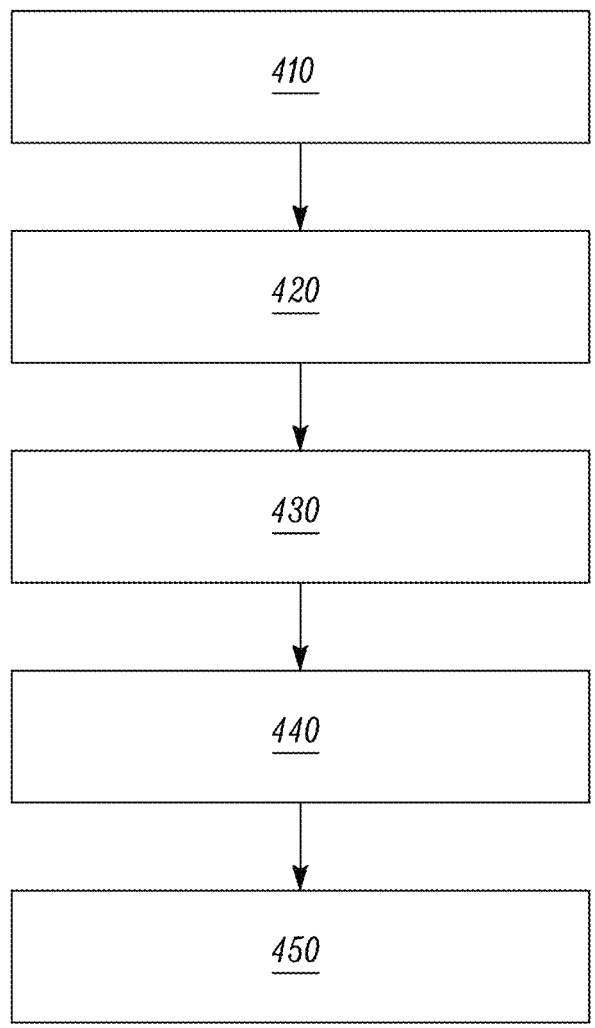
Figure 5B:
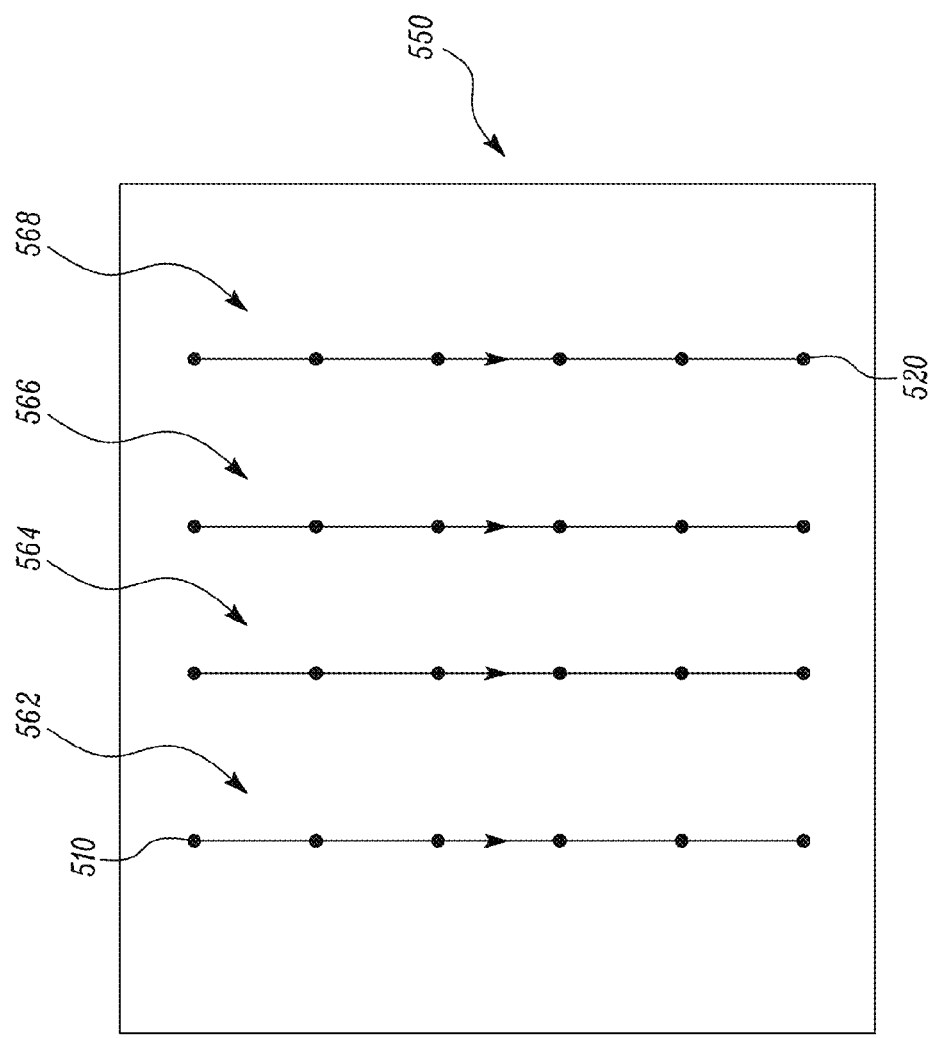
Figure 7:
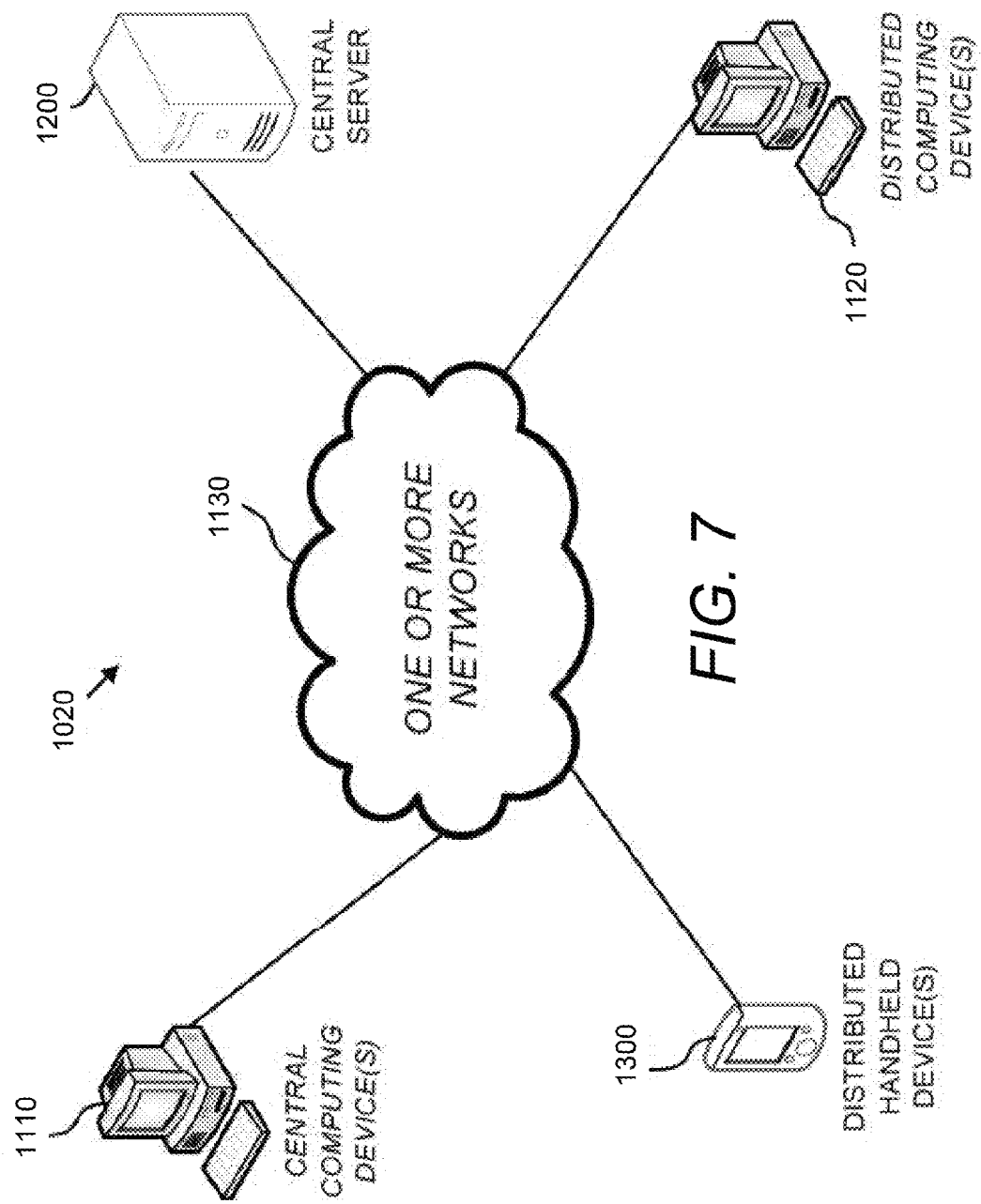
Figure 8A:
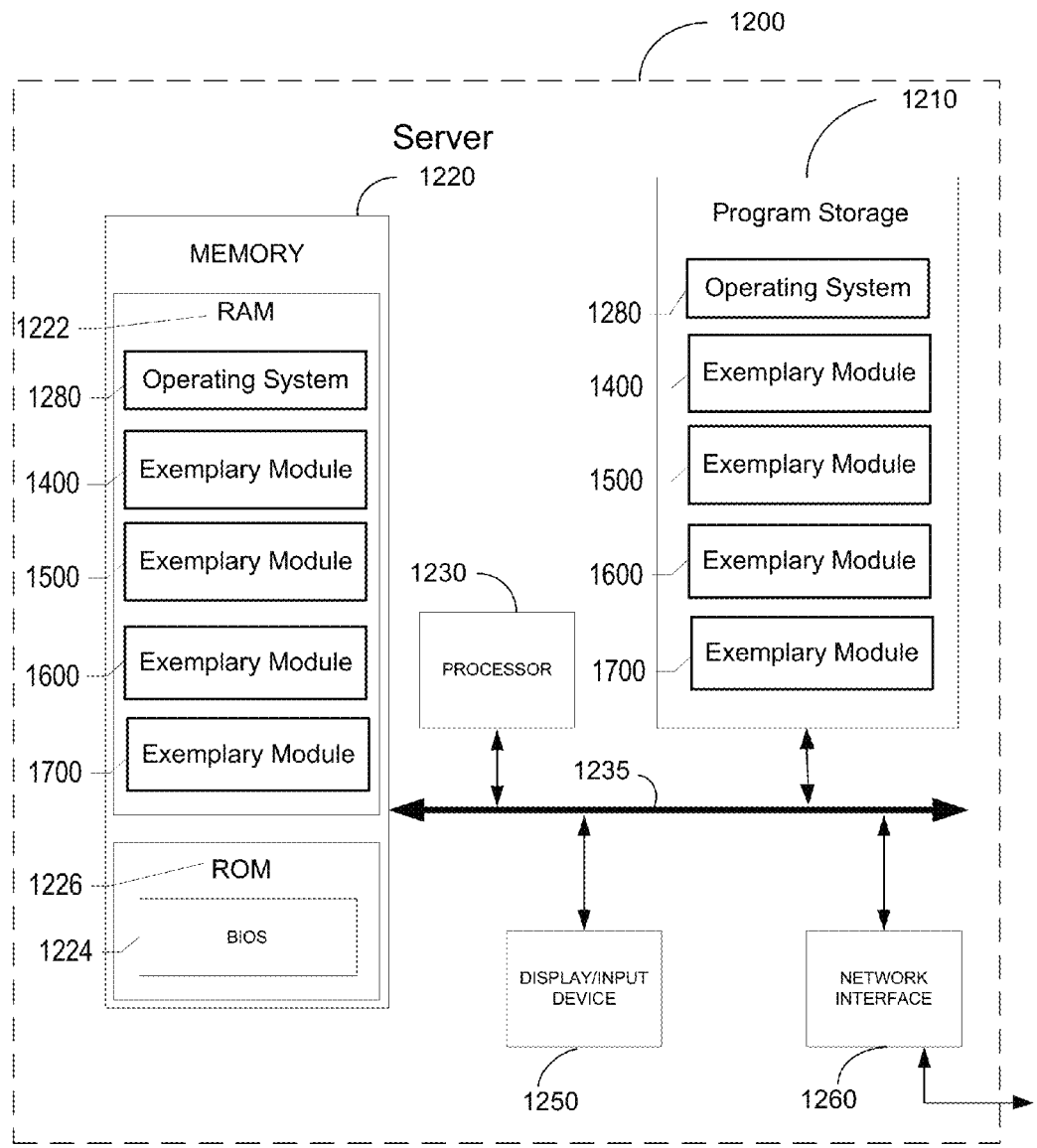
Figure 8B:
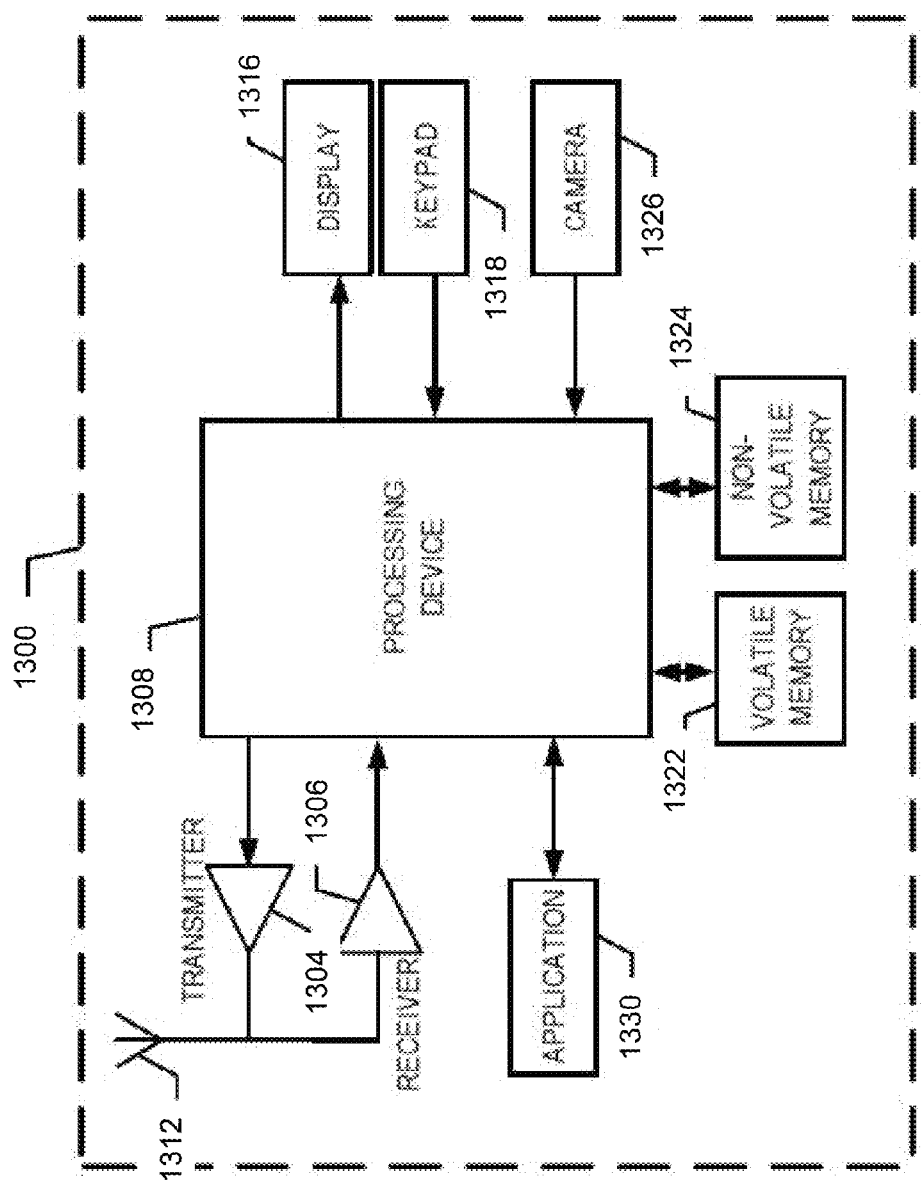

Having thus described the invention in general terms, reference will now be made to the accompanying drawings, which are not necessarily drawn to scale, and wherein:

FIG. 1 depicts a schematic perspective view of a first example embodiment of a setup for verifying the deflection speed of an energy beam;

FIG. 2 depicts a schematic perspective view of a second example embodiment of a setup for verifying the deflection speed of an energy beam;

FIG. 3 depicts an apparatus in which the inventive verifying method may be implemented;

FIG. 4 depicts a schematic flow chart of the method according to an embodiment of the present invention;

FIG. 5A depicts a first example embodiment of a deflectionning pattern for verifying the deflection speed;

FIG. 5B depicts a second example embodiment of a deflectionning pattern for verifying the deflection speed;

FIG. 5C depicts a third example embodiment of a deflectionning pattern for verifying the deflection speed;

FIG. 6A depicts an example embodiment of a dot pattern with correct deflection speed;

FIG. 6B depicts an example embodiment of the same dot pattern as in FIG. 6A with incorrect deflection speed;

FIG. 7 is a block diagram of an exemplary system 1020 according to various embodiments;

FIG. 8A is a schematic block diagram of a server 1200 according to various embodiments; and FIG. 8B is a schematic block diagram of an exemplary mobile device 1300 according to various embodiments.

DETAILED DESCRIPTION OF VARIOUS EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

FIG. 3 depicts an example embodiment of a freeform fabrication or additive manufacturing apparatus 300 in which the inventive verification method may be implemented. The apparatus 300 in at least this embodiment comprises an electron gun 302; a camera 304; two powder hoppers 306, 307; a start plate 316; a build tank 312; a powder distributor 310; a build platform 314; and a vacuum chamber 320.

The vacuum chamber 320 is capable of maintaining a vacuum environment by means of or via a vacuum system, which system may comprise a turbomolecular pump, a scroll pump, an ion pump and one or more valves which are well known to a skilled person in the art and therefore need no further explanation in this context. The vacuum system may be controlled by a control unit 350.

The electron gun 302 is generating an electron beam which may be used for melting or fusing together powder material 318 provided on the start plate 316. The electron gun 302 may be provided in the vacuum chamber 320. The control unit 350 may be used for controlling and managing the electron beam emitted from the electron beam gun 302. At least one focusing coil (not shown), at least one deflection coil (not shown) and an electron beam power supply (not shown) may be electrically connected to the control unit 350. In an example embodiment of the invention the electron gun generates a focusable electron beam with an accelerating voltage of about 60 kV and with a beam power in the range of 0-10 kW. The pressure in the vacuum chamber may be in the range of $1 \times 10^{-1}$-$1 \times 10^{-6}$ mBar when building the three-dimensional article by fusing the powder layer by layer with the energy beam.

Instead of melting the powder material with an electron beam a laser beam may be used. The vacuum chamber may be optional when using a laser beam source instead of the electron beam source.

The powder hoppers 306, 307 comprise the powder material to be provided on the start plate 316 in the build tank 312. The powder material may for instance be pure metals or metal alloys such as titanium, titanium alloys, aluminum, aluminum alloys, stainless steel, Co—Cr—W alloy, etc.

The powder distributor 310 is arranged to lay down a thin layer of the powder material on the start plate 316. During a work cycle the build platform 314 will be lowered successively in relation to the ray gun after each added layer of powder material. In order to make this movement possible, the build platform 314 is in one embodiment of the invention arranged movably in vertical direction, i.e., in the direction indicated by arrow P. This means that the build platform 314 starts in an initial position, in which a first powder material layer of necessary thickness has been laid down on the start plate 316. A first layer of powder material may be thicker than the other applied layers. The reason for starting with a first layer which is thicker than the other layers is that one does not want a melt-through of the first layer onto the start plate. The build platform is thereafter lowered in connection with laying down a new powder material layer for the formation of a new cross section of a three-dimensional article. Means for lowering the build platform 314 may for instance be through a servo engine equipped with a gear, adjusting screws etc.

A model of the three dimensional article may be generated via a CAD (Computer Aided Design) tool.

After a first layer is finished, i.e., the fusion of powder material for making a first layer of the three-dimensional article, a second powder layer is provided on the work table 316. The second powder layer is distributed according to the same manner as the previous layer. However, there might be alternative methods in the same additive manufacturing machine for distributing powder onto the work table. For instance, a first layer may be provided by means of or via a first powder distributor, a second layer may be provided by another powder distributor. The design of the powder distributor is automatically changed according to instructions from the control unit. A powder distributor in the form of a single rake system, i.e., where one rake is catching powder fallen down from both a left powder hopper 306 and a right powder hopper 307, the rake as such can change design.

After having distributed the second powder layer on the work table 316, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

FIG. 1 depicts a schematic perspective view of a first example embodiment of a setup 100 for verifying the deflection speed. The setup 100 comprises a laser source 110, a tiltable mirror 120, a camera 130, a control unit 140 and a work piece 150.

The laser source is used for generating a laser beam 160 which may be deflected on the work table 150 by means of or via the tiltable mirror 120. By changing the angle of the tiltable mirror the laser beam 160 may be moved at any desired position within a predetermined maximum area. The deflection speed of the laser beam may be altered by changing the speed of tilting the tiltable mirror, a slow change of tilting degree of the mirror may result in a slow deflection speed of the laser beam and a rapid change of tilting degree of the mirror may result in a rapid deflection speed of the laser beam.

An example embodiment of verifying the deflection speed may first start with determining a pattern 170 which is to be provided on the work piece 150. The pattern 170 may be one or two dimensional. Obviously, if using a one dimensional pattern the deflection speed may only be verified one-dimensionally if not rotating the same pattern and repeating the verifying process. With a two dimensional pattern the deflection speed may be verified in x- and y-direction simultaneously. The verification process may work with a perfectly flat work piece as well as with a work piece not being perfectly flat, i.e., the position of the work piece as well as the angle of the work piece may not be known prior to the verification process. However, the exact position and angle of the work piece is not a prerequisite for this verification process.

In a first step 410 according to the present invention the pattern may be provided on the work table by switching on and off the laser beam while deflecting the laser beam with a first deflection speed.

In FIG. 5A it is illustrated a first example embodiment of a pattern 550 which may be used for verifying the deflection speed of an energy beam. The pattern comprising 6 rows, where each row comprising 4 dots. The dots are meant to be generated by the energy beam 160, 260. A start point for the pattern is denoted by 510 and a finish point is denoted by 520. The energy beam may produce the pattern 550 of dots in the order given by the arrows in FIG. 5. Obviously there are many alternative ways of deflection the energy beam through each and every point in the given pattern illustrated in FIG. 5, such as the reverse direction or a random direction. Any one of the dots may be chosen as start and finish point.

In FIG. 5B it is illustrated a second example embodiment of a pattern 550 which may be used for verifying the deflection speed of an energy beam. The pattern comprising 4 columns 562, 564, 566, 568 where each column comprising 6 dots. The dots are meant to be generated by the energy beam 160, 260. A start point for the pattern is denoted by 510 and a finish point is denoted by 520. The energy beam may produce the pattern 550 of dots in the order given by the arrows in FIG. 5. Obviously there are many alternative ways of deflection the energy beam through each and every point in the given pattern illustrated in FIG. 5B, such as the reverse direction or a random direction. Any one of the dots may be chosen as start and finish point.

In FIG. 5C it is illustrated a third example embodiment of a pattern 550 which may be used for verifying the deflection speed of an energy beam. The pattern comprising a continuous star like pattern whereas in FIGS. 5A and 5B are illustrating a discontinuous pattern.

A start point for the pattern is denoted by 510 and a finish point is denoted by 520. The start and finish point 510, 520 are overlapping each other. Any position in the star may be chosen as a start and finishing position.

A laser beam may be switched on and off with a given frequency, which may be constant for producing a dotted or dashed pattern or be switched on continuously for producing a continuous pattern as exemplified in FIG. 5C.

The pattern 550 is first produced with a first deflection speed V. A first position of the pattern generated by the laser beam deflected at the first deflection speed V may be detected by the camera 140 denoted by 420 in FIG. 4. The pattern may be generated by switching on and off the laser source 110 at given positions while providing the pattern 550 in the way illustrated in FIGS. 5A and 5B. The same pattern 550 is then produced by altering the deflection speed denoted by 430 in FIG. 4. The deflection speed may be altered to a second deflection speed 2V which is twice as fast as the first deflection speed V. The pattern may once again be generated by switching on and off the laser source 110 at given positions while providing the pattern 550 in the way illustrated in FIG. 5A or 5B or be kept continuously on while providing a continuous pattern as exemplified in FIG. 5C. A second position of the pattern generated by the laser beam when using the second deflection speed 2V may be detected by the camera 140 denoted by 440 in FIG. 4. The first and second positions are then compared with each other.

The image may be taken by the camera 304 provided inside or outside the vacuum chamber 320. The camera 304 may be any type of camera for example an IR-camera (Infrared-camera), NIR-camera (Near Infrared-camera), a VISNIR-camera (Visual Near Infrared-camera), a CCD camera (Charged Coupled Device-camera), a CMOS-camera (Complementary Metal Oxide Semiconductor-camera), a digital camera.

The pattern may be engraved in the work table, i.e., the surface of the work table is melted. Alternatively the energy beam may only reflect the energy beam in the pattern, i.e., the surface of the work table is not melted. The image of the full pattern may be compiled from a number of different images taken at different times during the production of the pattern.

A laser source may be switched on and off at a given frequency, meaning that the duration of laser pulses may be fixed. When changing the deflection speed of the laser beam to the second speed, which in the given example is twice the deflection speed 2V, the time between on pulses need to be twice as short compared to when the deflection speed is at the first deflection speed V in order to produce the same pattern. Assuming that the on-off frequency is constant, any deviation in the pattern produced by the first and the second deflection speed can be the to come from a non-calibrated deflection speed of the mirror 120. A translation direction of the first position in relation to the second position may give information on how to adjust the deflection speed of the mirror. The translation direction may also vary in two dimensions, i.e., translated in both X and Y direction. Obviously any number of deflection speeds may be used in the deflection speed verification method. The idea is to provide the same pattern with different deflection speeds and/or different deflection order and/or different deflection direction. A deviation between a position produced with a first deflection speed and/or deflection order and/or deflection direction compared with a second deflection speed/order/direction may give information to the operator that the deflection speed is incorrect. A reversing of the deflection direction may result in forward and reverse patterns not perfectly overlaying each other indicating that the tilting mirror is slower in a first direction compared to a second direction, where the first and second directions may be opposite to each other. The verification of the deflection speed may be used as a control/quality feature in an additive manufacturing apparatus. If the deflection speed is determined to be out of specification a warning signal may be sent to the operator of the machine. In an alternative embodiment when the deflection speed is determined to be out of specification the additive manufacturing machine may be switched off or put in an idle state.

The first and second positions are compared, denoted by 450, wherein the deflection speed is verified if each one of the first positions is deviating less than a predetermined distance from corresponding second positions.

FIG. 6A depicts an example embodiment of a dot pattern with a verified deflection speed. A regular equidistance dot pattern is first provided on a work piece with a first deflection speed. The first deflection speed is symbolized in FIG. 6A with circles. The same regular equidistance dot pattern is then provided on a work piece with a second deflection speed. The second deflection speed is symbolized in FIG. 6A with crosses. The second deflection speed is twice as large as the first deflection speed. The work piece may be the same work piece or a different work piece for the two different deflection speeds.

In FIG. 6A the dotted pattern for the two different deflections speeds are superimposed on each other without any lateral offset of the two patterns. Of course the pattern having the twice as large speed has half the number of dots given that the on/off frequency of the energy beam is the same for the first and second deflection speed. In FIG. 6A the deflection speed can be the to be verified since corresponding positions with the first and second deflection speed are not deviating more than a predetermined distance, here the predetermined distance is zero.

In FIG. 6B the dot pattern for the two different deflection speeds are not superimposed on each other. In FIG. 6B the pattern provided with the first deflection speed v is offset with respect to the pattern provided with the second deflection speed 2v. The offset is denoted by 610. Since the offset of the second deflection speed is to the left compared to the first deflection speed, the second deflection speed is too slow. An offset to the right in the same picture would mean a too fast deflection speed.

The predetermined allowable distance (offset) may in a first example embodiment be less than 100 µm. In an additive manufacturing process the offset may be accepted to be larger or smaller than the 100 µm depending on the type of product to be manufactured. Parts with high tolerance requirements may need an offset in the range of 50 µm in order to be accepted and parts with low tolerance requirements may accept an offset larger than 200 µm.

When using a continuous pattern, as depicted in FIG. 5C, the pattern may be more or less distorted when the deflection speed is not verified. In a continuous pattern a predetermined number of positions are detected for the different deflection speeds and their relative positions are compared. The predetermined positions in the continuous pattern may be a regular pattern or a stochastically pattern. The same pattern may be used for the two different deflection speeds.

The work piece may be provided with a reference pattern. This reference pattern may be used for calibrating the scan speed and relative position but also for detecting other deviations in the energy beam train.

FIG. 2 depicts a schematic perspective view of a second example embodiment of a setup 200 for verifying the deflection speed. The setup 200 comprises an electron beam source 210, a camera 230, a control unit 240 and a work piece 250.

The electron beam source is used for generating an electron beam 260 which may be deflected on the work table 250 of or via at least one deflection coil (not shown). By changing the magnetic field of the deflection coil the electron beam 260 may be moved at any desired position within a predetermined maximum area.

The deflection speed of the electron beam may be altered by changing the magnetic field of the deflection coil, i.e., by ramping the electrical current in the deflection coil at different speeds, where a higher ramping speed will result in a larger deflection speed than a lower ramping speed. The verification of the deflection speed is identical as previously described in relation to FIG. 1. The only difference between FIGS. 1 and 2 is the energy beam source and how the energy beam is deflected.

In another aspect of the invention it is provided a program element configured and arranged when executed on a computer to implement a method for verifying a deflection speed of an energy beam spot. The program element may specifically be configured to perform the steps of: generating a predetermined pattern on a work table with the energy beam spot while deflecting the energy beam spot with a first deflection speed; detecting first positions of the energy beam spot on the work table created with the first deflection speed; generating the predetermined pattern on a work table with the energy beam spot while deflecting the energy beam spot with a second deflection speed; detecting second positions of the energy beam spot on the work table created with the second deflection speed; and comparing the first and second positions, wherein the deflection speed is verified if each one of the first positions are deviating less than a predetermined distance from corresponding ones of the second positions.

The program element may be installed in a computer readable storage medium. The computer readable storage medium may be a control unit as described elsewhere herein or another separate and distinct control unit. The computer readable storage medium and the program element, which may comprise computer-readable program code portions embodied therein, may further be contained within a non-transitory computer program product. Further details regarding these features and configurations are provided, in turn, below.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

FIG. 7 is a block diagram of an exemplary system 1020 that can be used in conjunction with various embodiments of the present invention. In at least the illustrated embodiment, the system 1020 may include one or more central computing devices 1110, one or more distributed computing devices 1120, and one or more distributed handheld or mobile devices 1300, all configured in communication with a central server 1200 (or control unit) via one or more networks 1130. While FIG. 7 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2G), 2.5G, third-generation (3G), and/or fourth-generation (4G) mobile communication protocols, or the like. More particularly, the one or more networks 1130 may be capable of supporting communication in accordance with 2G wireless communication protocols IS-136 (TDMA), GSM, and IS-95 (CDMA). Also, for example, the one or more networks 1130 may be capable of supporting communication in accordance with 2.5G wireless communication protocols GPRS, Enhanced Data GSM Environment (EDGE), or the like. In addition, for example, the one or more networks 1130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1020 may be configured to communicate with one another in accordance with techniques such as, for example, radio frequency (RF), Bluetooth™, infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-1300 are illustrated in FIG. 7 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

FIG. 8A is a schematic diagram of the server 1200 according to various embodiments. The server 1200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which typically includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server 1200. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1020. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server 1200 components may be located geographically remotely from other server components. Furthermore, one or more of the server 1200 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface—as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 1200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

FIG. 8B provides an illustrative schematic representative of a mobile device 1300 that can be used in conjunction with various embodiments of the present invention. Mobile devices 1300 can be operated by various parties. As shown in FIG. 8B, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 1300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 308). The user input interface can comprise any of a number of devices allowing the mobile device 1300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1020 as a whole.

The invention is not limited to the above-described embodiments and many modifications are possible within the scope of the following claims. Such modifications may, for example, involve using a different source of energy beam than the exemplified electron beam such as a laser beam. Other materials than metallic powder may be used, such as the non-limiting examples of: electrically conductive polymers and powder of electrically conductive ceramics. Images taken from more than 2 layers may also be possible, i.e., in an alternative embodiment of the present invention for detecting a defect at least one image from at least three, four or more layers are used. A defect may be detected if the defect position in the three, four or more layers are at least partly overlapping each other. The thinner the powder layer the more powder layers may be used in order to detect a factual defect.

Indeed, a person of ordinary skill in the art would be able to use the information contained in the preceding text to modify various embodiments of the invention in ways that are not literally described, but are nevertheless encompassed by the attached claims, for they accomplish substantially the same functions to reach substantially the same results. Therefore, it is to be understood that the invention is not limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for verifying a deflection speed of an energy beam spot, said method comprising the steps of:

generating, via an energy beam source, an energy beam spot;

generating, via one or more computer processors associated with a control unit, a predetermined pattern on a work table with said energy beam spot while deflecting said energy beam spot with a first deflection speed;

detecting, via said one or more computer processors associated with said control unit, first positions of said energy beam spot on said work table created with said first deflection speed;

generating, via said one or more computer processors associated with said control unit, said predetermined pattern on a work table with said energy beam spot while deflecting said energy beam spot with a second deflection speed;

detecting, via said one or more computer processors associated with said control unit, second positions of said energy beam spot on said work table created with said second deflection speed; and comparing, via said one or more computer processors associated with said control unit, said first and second positions, wherein:

said deflection speed is verified and building of a three-dimensional article layer-wise may proceed if each one of said first positions are deviating less than a predetermined distance from corresponding ones of said second positions; and said building of said three-dimensional article layer-wise is prevented and a warning signal is generated and transmitted, via said one or more computer processors associated with said control unit, if any one of said first and second positions is deviating more than said predetermined distance.

2. The method according to claim 1, wherein said pattern is a continuous pattern.

3. The method according to claim 1, wherein said pattern is a discontinuous pattern.

4. The method according to claim 3, wherein said discontinuous pattern is created by switching on and off said energy beam.

5. The method according to claim 1, wherein said energy beam spot is at least one of an electron beam spot or a laser beam spot.

6. The method according to claim 1, wherein said positions are detected by at least one of an IR-camera, a CCD-camera, a digital camera, a CMOS camera, or a MR-camera.

7. The method according to claim 1, wherein said pattern is a one-dimensional pattern.

8. The method according to claim 1, wherein said pattern is a two-dimensional pattern.

9. The method according to claim 1, wherein said predetermined pattern provided on said worktable with said first and second deflection speeds is superimposed on the same work table.

10. The method according to claim 1, wherein said worktable is provided with a reference pattern.

11. The method according to claim 1, wherein said predetermined pattern is deflectionned in a forward direction and a reverse direction for each deflection speed.

12. The method according to claim 1, wherein said pattern is provided on said work table having a surface temperature above 500° C.

13. The method according to claim 1, wherein said predetermined distance is less than 100 μm.

14. The method according to claim 1, wherein:
the method further comprises the step of receiving and storing, within one or more memory storage areas, a model of at least one three-dimensional article; and
when said deflection speed is verified, said building of said three-dimensional article layer-wise proceeds based upon said model.

15. An additive manufacturing apparatus for verifying a deflection speed of an energy beam spot, said apparatus comprising:
an energy beam source configured to generate an energy beam spot; and
a control unit configured for:
generating a predetermined pattern on a work table with said energy beam spot while deflecting said energy beam spot with a first deflection speed;
detecting first positions of said energy beam spot on said work table created with said first deflection speed;
generating said predetermined pattern on a work table with said energy beam spot while deflecting said energy beam spot with a second deflection speed;
detecting second positions of said energy beam spot on said work table created with said second deflection speed; and
comparing said first and second positions, wherein said deflection speed is verified if each one of said first positions are deviating less than a predetermined distance from corresponding ones of said second positions.

16. The additive manufacturing apparatus of claim 15, further comprising an image capture device configured to capture and compare said first and second positions.

17. The additive manufacturing apparatus of claim 15, further comprising at least one mirror positioned in a pathway between said first energy beam source and said work piece structure, said at least one mirror being configured for, via said control unit, directing said first energy beam.

18. The additive manufacturing apparatus of claim 17, wherein said at least one mirror is a tiltable or otherwise movable mirror.

19. A non-transitory program element configured and arranged when executed on a computer to implement a method for verifying a deflection speed of an energy beam spot, said method comprising the steps of:
generating a predetermined pattern on a work table with said energy beam spot while deflecting said energy beam spot with a first deflection speed;
detecting first positions of said energy beam spot on said work table created with said first deflection speed;
generating said predetermined pattern on a work table with said energy beam spot while deflecting said energy beam spot with a second deflection speed;
detecting second positions of said energy beam spot on said work table created with said second deflection speed; and
comparing said first and second positions,
wherein:
said deflection speed is verified and building of a three-dimensional article layer-wise may proceed if each one of said first positions are deviating less than a predetermined distance from corresponding ones of said second positions; and
said building of said three-dimensional article layer-wise is prevented and a warning signal is generated and transmitted, via said one or more computer processors associated with said control unit, if any one of said first and second positions is deviating more than said predetermined distance.

20. A non-transitory computer readable medium having stored thereon the program element according to claim 19.

21. A non-transitory computer program product comprising at least one non-transitory computer-readable storage medium having computer-readable program code portions embodied therein, the computer-readable program code portions comprising:
an executable portion configured for generating a predetermined pattern on a work table with said energy beam spot while deflecting said energy beam spot with a first deflection speed;
an executable portion configured for detecting first positions of said energy beam spot on said work table created with said first deflection speed;
an executable portion configured for generating said predetermined pattern on a work table with said energy beam spot while deflecting said energy beam spot with a second deflection speed;
an executable portion configured for detecting second positions of said energy beam spot on said work table created with said second deflection speed; and
an executable portion configured for comparing said first and second positions, wherein said deflection speed is verified and building of a three-dimensional article layer-wise may proceed if each one of said first positions are deviating less than a predetermined distance from corresponding ones of said second positions, and wherein said building of said three-dimensional article layer-wise is prevented and a warning signal is generated and transmitted, via said one or more computer processors associated with said control unit, if any one of said first and second positions is deviating more than said predetermined distance.

* * * * *